United States Patent [19]

Taylor et al.

[11] Patent Number: 4,670,528
[45] Date of Patent: Jun. 2, 1987

[54] POLYMERIC PYRIDINIUM YLIDES AND PRODUCTS PREPARED FROM SAME

[75] Inventors: Lloyd D. Taylor, Lexington, Mass.; Michael K. Haubs, Bad Kreuznach, Fed. Rep. of Germany

[73] Assignee: Polaroid Corporation, Cambridge, Mass.

[21] Appl. No.: 879,394

[22] Filed: Jun. 27, 1986

Related U.S. Application Data

[62] Division of Ser. No. 617,726, Jun. 6, 1984, Pat. No. 4,617,253.

[51] Int. Cl.[4] ............................................. C08F 126/00
[52] U.S. Cl. ..................................................... 526/263
[58] Field of Search .......................................... 526/263

[56] References Cited

U.S. PATENT DOCUMENTS

| | | | |
|---|---|---|---|
| 2,718,516 | 9/1955 | Bortnick | 260/86.1 |
| 3,081,168 | 3/1963 | Leekley et al. | 96/35 |
| 3,412,077 | 11/1968 | Szita et al. | 526/260 |
| 3,641,145 | 2/1972 | Culbertson et al. | 260/558 H |
| 3,985,793 | 10/1976 | Brooks et al. | |
| 4,282,201 | 8/1981 | Choi | 424/14 |

FOREIGN PATENT DOCUMENTS 2456823  6/1975  Fed. Rep. of Germany .

OTHER PUBLICATIONS

T. Regulski, Organic Coatings and Applied Polymer Science Proceedings, vol. 48, pp. 998-1002, 1003-1007, (1983).

T. Sasaki et al, in "Structures of the Photochemical Isomerization Products of Pyridinium Ylides, Diazepines and Their Diels-Alder Adducts", Journal of the Chemical Society, London, Chemical Communications, Part D, vol. 9, pp. 432-433, (1969).

W. J. McKillip et al., in "The Chemistry of Aminimides", Chemical Reviews, vol. 73, No. 3, pp. 255-281, (1973).

M. R. Thomas, Organic Coatings and Applied Polymer Science Proceedings, vol. 46, pp. 506-513, (1981).

Organic Syntheses, Collective vol. 5, pp. 43-45, 1973.

J. Streith et al., in Photochemical Syntheses of Ethyl 1H-Diazepine-1-Carboxylate, Angewandte Chemie: International Edition in English, vol. 7, No. 2, pp. 129, 1968.

*Primary Examiner*—Paul R. Michl
*Assistant Examiner*—Alex H. Walker
*Attorney, Agent, or Firm*—Louis G. Xiarhos

[57] ABSTRACT

Polymers containing pyridinium ylides moieties are subjected to actinic irradiation to convert the pyridinium ylide moieties to water-insoluble or hydrophobic N-acyl-diazepine polymers. The polymeric pyridinium ylides can be used for the waterproofing or hydrophobization of surfaces and for the production of printing plates, photoresistors, printed circuit boards and the like.

9 Claims, 6 Drawing Figures

POLYMERIC PYRIDINIUM YLIDES AND PRODUCTS PREPARED FROM SAME

This is a division of application Ser. No. 617,726, filed June 6, 1984, now U.S. Pat. No. 4,617,253.

BACKGROUND OF THE INVENTION

This invention relates to certain polymeric products prepared from pyridinium ylides. More particularly, it relates to hydrophophic, protective polymers and to articles, including photoresists, prepared from polymeric pyridinium ylides by a photolytic reaction.

The use of photopolymerization reactions in the printing and graphic arts fields for the production of relief and lithographic printing plates has been well known. Suitable methods for the production of plates for the printing and graphic industries are described, for example, in Neblette's Handbook of Photography And Repography, Seventh Edition, pp. 439–40 (1977). Typically, a monomeric compound on a suitable plate support material will be selectively exposed to a source of light so as to effect a photopolymerization (insolubilization) in exposed areas. The difference in solubility, between unexposed and exposed (polymerized) areas, permits easy development.

The principles of photopolymerization are also utilized in photoengraving and lithographic plate-making by the use of long-chain polymers whose molecules are able to crosslink under the action of light to form a three-dimensional molecular network. Typically, the photo-crosslinked polymer will be insoluble, and will be soluble only in powerful solvent mixtures of the type used in paint stripping. Stencils produced by the photo-crosslinking reaction are photoresists which are highly resistant to commonly used solutions; solvent development is used to remove the original long-chain polymer from unexposed areas.

In U.S. Pat. No. 3,081,168 (issued Mar. 12, 1963 to R. M. Leekly et al.), the production of relief plates using polyamides as a preformed polymer is described. Photosensitivity is imparted to the polyamide, which is carried on a support, by including with the polyamide, a photopolymerizable unsaturated compound. Following a selective exposure to light, which induces a decrease in solubility in exposed areas, unexposed areas are removed with a developer. After development, the base material (e.g., metal) can be etched by chemical etching or abrasive blast to form a relief image in the base material. If desired, an offset plate can be prepared by coating the photosensitive polyamide composition onto a hydrophilic support. The image obtained upon photoexposure and development will carry an ink and the wet support will resist ink.

In the production of plates by resort to photoreaction chemistry, a reactive and photopolymerizable monomeric compound will oftentimes be employed. The compounds are frequently liquid or in a gaseous form which may hamper efficient handling and the production of coatings suited to photopolymerization. Preformed polymers which are photo-crosslinkable may exhibit limited photo-reactivity or sensitivity. Accordingly, it will be appreciated that there will be application in photosensitive plate-making for a polymeric compound which can be conveniently coated from an aqueous medium onto a suitable substrate or carrier material and which can be readily converted, by a chemical modification induced by exposure to irradiation, to an insoluble or hydrophobic material.

SUMMARY OF THE INVENTION

It has been found according to the present invention that products and articles including a hydrophobic or water-insoluble protective polymer material can be prepared by subjecting a layer or coating of a polymeric pyridinium ylide to a source of actinic irradiation sufficient to induce a chemical modification thereof and production of the hydrophobic or water-insoluble protective polymer material. According to one of its product aspects, the present invention provides a photosensitive article comprising a suitable substrate material carrying a layer of photosensitive pyridinium ylide polymer, the polymer being adapted, upon exposure to actinic radiation, to conversion to a water-insoluble or hydrophobic protective polymeric material.

According to one of its method aspects, there is provided a method whereby an article carrying a layer of photosensitive polymeric pyridinium ylide is irradiated sufficiently to induce a photochemical modification of the polymer and resulting water insolubility or hydrophobicity. A preferred method comprises selectively irradiating an article carrying a layer of photosensitive polymeric pyridinium ylide, to convert exposed areas to a water-insoluble or hydrophobic material; and washing from the article, in areas of non-exposure, the unexposed polymeric pyridinium ylide; thereby to provide an image in water-insoluble or hydrophobic polymeric material. Certain novel polymers, compositions containing photosensitive polymeric pyridinium ylides, and methods for the use thereof are provided by the present invention. Objects of the present invention, details, constructions, operations, uses, advantages and modications thereof will be apparent from the following description, taken in conjunction with the illustrative drawings of certain embodiments thereof.

DETAILED DESCRIPTION OF THE INVENTION

Figure 1:
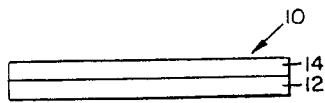
FIG. 1 is a cross-sectional edge view of a photosensitive article of the invention.

In the production of products of the invention, a layer or coating of polymeric pyridinium ylide is converted by actinic radiation to a polymeric material exhibiting water insolubility or hydrophobicity. The pyridinium ylide polymers suited to this purpose are polymers which include the pyridinium ylide moieties of formulas (I) and/or (II):

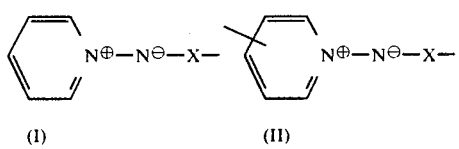

wherein X is

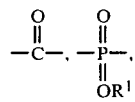

or —SO$_2$—; and R$^1$ is alkyl, aryl, alkaryl or aralkyl. These moieties, are a part of the polymer and are either pendant from the polymeric backbone, as in the case of the moiety of formula (I) or (II), or comprise a part of the backbone of the polymer, in the case of the moiety of formula (II). Preferred X groups include

and —SO$_2$—. Polymers which contain these pyridinium ylide moieties are for convenience referred to hereinafter as polymeric pyridinium ylides.

When a polymeric pyridinium ylide containing the moiety (I) or (II) is subjected to photolysis, the resulting chemical modification (a conversion of the pyridinium ylide to an N-acyl-diazepine via ring-expansion) is accompanied by a substantial change in polymer properties. While the pyridinium ylide polymer is generally water-soluble and can be conveniently coated from an aqueous coating medium onto a suitable substrate material, the corresponding N-acyl-diazepine polymer produced upon irradiation is characterized by insolubility in water, or hydrophobicity. This substantial change in polymer properties makes possible the application of pyridinium ylide polymers to the production of various articles, including photoresists, stencil coatings, duplicating pads, lithographic and relief plates, printed circuit boards and chemically etched electrode patterns on glass or other supports.

The chemical conversion (N-acyl-diazepine formation) can be illustrated by resort to the following scheme showing the conversion of a polymer having a preferred pyridium aminimide moiety to the corresponding N-acyl-diazepine:

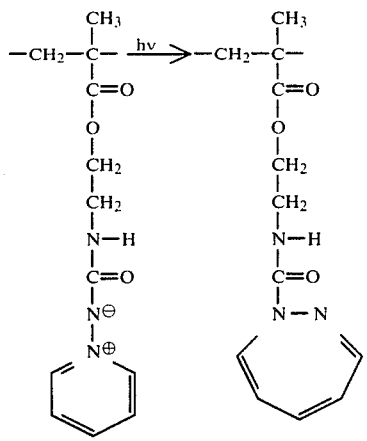

The accompanying changes in physical properties permit a variety of products to be prepared as mentioned hereinbefore. Accordingly, variations in the nature of the polymer can be used to accommodate particular applications. According to a preferred embodiment of the invention, the polymer will comprise a backbone having pendant pyridinium ylide moieties, the polymer comprising repeating units according to the formula (III)

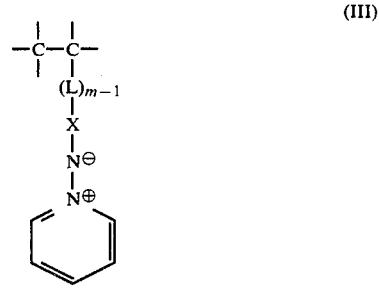

wherein L represents an organic linking or spacer group which serves to link the

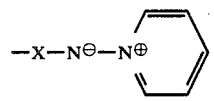

moiety to the polymer backbone; and m is the integer one or two.

It will be seen from inspection of the polymer unit represented by formula (III), that the pyridinium ylide moiety pendant from the polymer backbone may be attached either directly to the backbone (as where m is one) or through the organic linking group, L (m is two).

Preferably, the backbone of the polymer will comprise a plurality of interconnected units corresponding to the formula

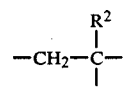

where $R^2$ is hydrogen, halogen or alkyl, such as can be readily provided by ethylenic polymerization of acrylic or methacrylic monomers.

The nature of organic linking or spacer group L can vary and, for example, can be a divalent radical such as

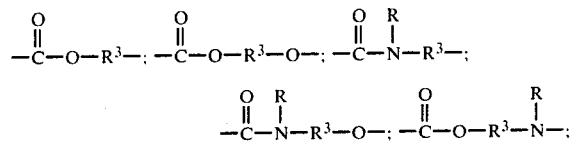

—Ar—; or —Ar—$R^3$— (wherein $R^3$ in each such radical represents a divalent alkylene radical, such as methylene, ethylene or 1,2-propylene; R is hydrogen, alkyl, aryl, alkaryl or aralkyl; and Ar represents an arylene radical such as phenylene or naphthylene). In each of the L groups containing a carbonyl group, such carbonyl group will preferably be attached to the backbone of the polymer. It will be appreciated that the nature of linking group L, and its molecular configuration and size, can be varied to influence the properties of the polymer produced by photo-induced modification, and the rate of the desired photo-reaction; and the choice of a suitable linking group may in part be influenced by synthetic considerations and ready availability of reactants for production of pyridinium ylide polymers hereof.

A preferred linking group L has the formula

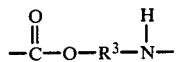

wherein $R^3$ is a divalent alkylene group such as ethylene. Preferred polymeric ylides having this linking group are the polymeric pyridinium aminimides (X is

Repeating units of such preferred polymers will have the formula (IV):

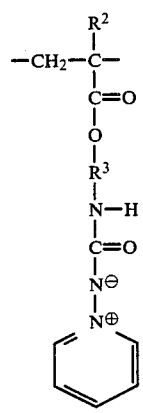

wherein $R^2$ is hydrogen, halogen (e.g., chloro) or lower alkyl (e.g., methyl); and $R^3$ is alkylene. Polymers having the repeating units shown in formula (IV) contain a carbamate structure and can be conveniently obtained by polymerizing the reaction product of an isocyanatoalkyl ester (such as beta-isocyanato-ethyl methacrylate) and N-amino-pyridinium compound. The resulting polymers are readily converted to a water-insoluble or hydrophobic polymer upon irradiation and can be used in the manufacture of photoresists and printing plates.

The linking group L of the polymers shown in formula (III) can, if desired, be attached to two carbon atoms of the polymeric chain. A suitable example is the radical

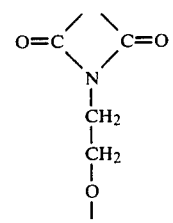

derived, for example, from a polymerizable maleimide. Such a linking group can be present in the repeating unit of a pyridinium ylide polymer such as is represented by the unit of the formula

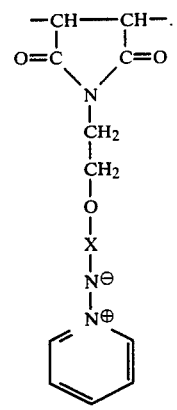

If desired, the pyridinium ylide moiety of polymers useful herein can be incorporated into the backbone of a polymer. In this case, a suitable pyridinium ylide moiety is the moiety of formula (II), i.e., the

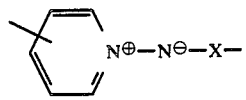

moiety. A polymer including the pyridinium ylide moiety of formula (II) as part of the backbone is illustrated, for example, by reference to repeating units of the following formula (V):

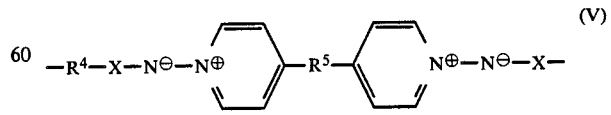

wherein $R^4$ is alkylene or arylene; $R^5$ is alkylene, such as 1,3-propylene; and X has the meaning described hereinbefore. A polymer as represented by formula (V) can be prepared by reaction of a dicarboxylic acid halide of the formula

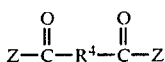

where each Z is halo (e.g., chloro) and a bis-amino-pyridinium compound of the formula

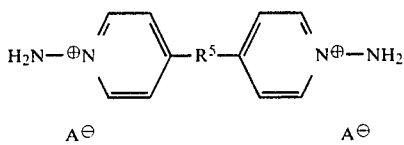

wherein $R^4$ and $R^5$ have the meanings aforedescribed and each $A^\ominus$ is a counteranion, such as chloride.

Another example of a pyridinium ylide polymer where the formula (II) moiety is present in the polymer backbone is illustrated by the polymer having aminimide repeating units of formula (VI)

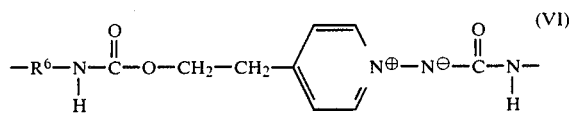

(VI)

Such a polymer can be prepared by reaction of a diisocyanate of the formula $R^6$—N=C=O)$_2$ wherein $R^6$ is alkylene or arylene with a 1-amino-pyridinium compound of the formula

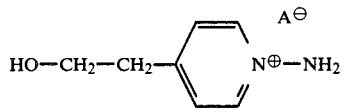

wherein $A^\ominus$ is a counteranion (e.g., chloride).

If desired, a pyridinium ylide polymer wherein the pyridinium ring is attached to the backbone of the polymer can be employed herein. An example of such a polymer is a polymer comprising repeating units of the formula (VII)

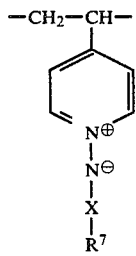

(VII)

wherein $R^7$ is alkyl; alkoxy; aryl (e.g., phenyl); alkaryl (e.g., tolyl); or aralkyl (e.g., benzyl); and X has the meaning described hereinbefore. Such a polymer can be prepared, for example, from poly(4-vinylpyridine) by: derivatization of the poly(4-vinylpyridine) to provide the 1-amino-pyridinium (using hydroxylamine-O-sulfonic acid and hydriodic acid treatments, according to the techniques described in Organic Syntheses, Collective Volume 5, John Wiley and Sons, pp. 43–45); and reaction of the resulting polymer with an acylating agent of the formula $R^7$—X—Z wherein $R^7$, X and Z have the meanings previously ascribed. This reaction scheme is illustrated by reference to the following:

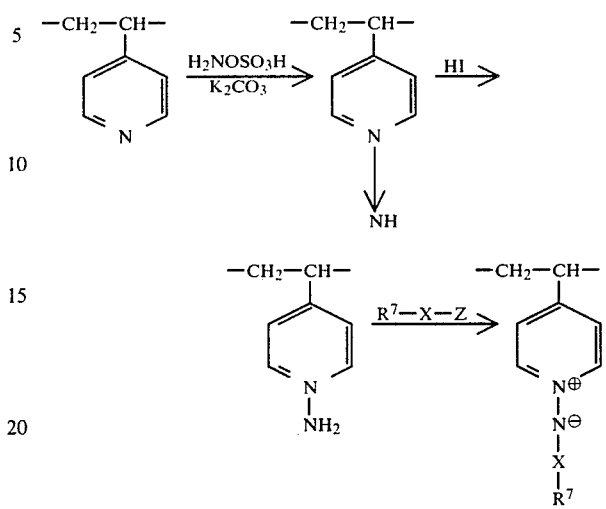

Examples of acylating agents that can be used in reference to the above-described reaction scheme include: $CH_3$—$SO_2$—Cl; $(CH_3O)_2$—P(O)Cl; $CH_3$—C(O)Cl; or the esters or anhydrides thereof. Phenyl isocyanate can also be used.

If desired, hydroxy-containing polymers having ylide groups attached thereto through an ether linkage can be prepared by reaction of a polymer having a plurality of hydroxyl groups (e.g., cellulose, hydroxyethyl cellulose or hydroxypropyl cellulose) with, for example, a compound of the formula

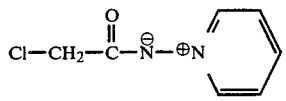

using the procedure described in U.S. Pat. No. 4,016,340 (issued Apr. 5, 1977 to H. S. Kolesinski et al.).

The polymeric pyridinium ylides containing the essential pyridinium ylide moieties of formulas (I) and/or (II) can, if desired, contain substituent groups on the pyridinium nucleus. Alkyl, aryl, halo, nitro and other substituents can be used to modify the properties of the polymeric pyridinium ylide as desired. It will be appreciated that the nature of the substituents present may alter the absorption characteristics of the pyridinium ylide moiety and may influence the conditions required to effect the desired conversion to the corresponding polymeric N-acyl-diazepine. Any substituent groups which do not negate or otherwise adversely interfere with the desired conversion can, however, be employed. One or more methyl groups can, for example, be used and examples of such substituted-pyridinium moieties include 2-picolinium, 3-picolinium, 4-picolinium and 3,5-dimethyl-pyridinium. Two substituent groups can taken together complete a cyclic structure such as a quinolinium or isoquinolinium structure. As used herein, the term "pyridinium" is used to include substituted-pyridinium moieties, such that, moieties which may properly be termed picolinium, quinolinium or the like, will be considered pyridinium moieties as the term is used herein.

Among examples of polymeric pyridinium ylides that can be utilized according to the invention are polymers which include repeating units having the following formulas:
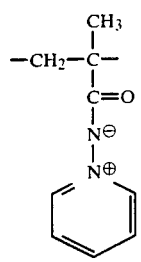 (VIII)
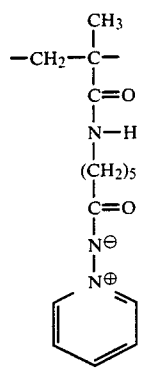 (IX)
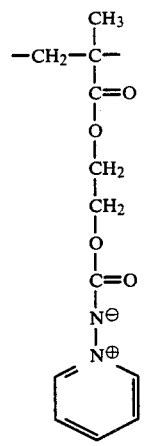 (X)
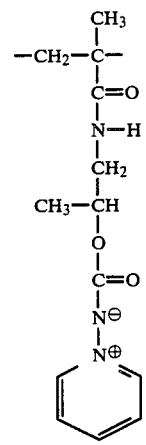 (XI)
-continued
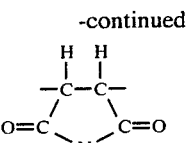 (XII)
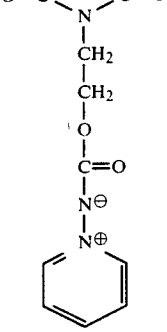 (XIII)
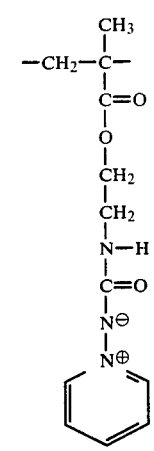 (XIV)
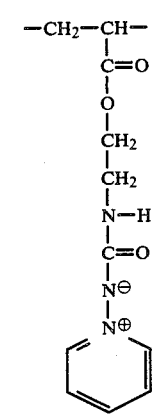 (XV)

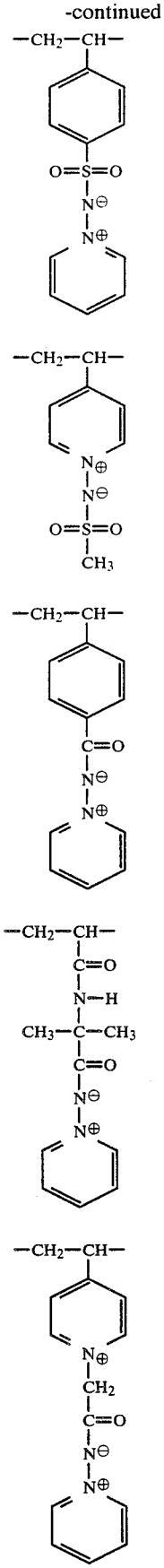

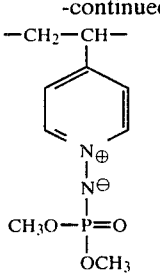

The polymers employed herein can be homopolymers or copolymers, including graft or block copolymers. The copolymers can contain units provided by copolymerization with various ethylenically unsaturated monomers such as alkyl acrylates, alkyl methacrylates, acrylamides, and methacrylamides. In general, these comonomeric units are utilized to provide particular predetermined properties to the polymer, such as coatability and viscosity and, in particular, polymerizability and controlled photo-reactivity.

In general, the polymers employed herein will contain the photo-reactive pyridinium ylide repeating units in an amount sufficient to allow for appreciable conversion from a relatively water-soluble condition to a condition of relative insolubility or hydrophobicity. In the copolymers, the proportion of photo-reactive units to total units will vary depending on the nature of the particular photo-reactive units employed, the nature of the comonomeric or any polymeric material that may be utilized therewith, and upon the particular application and product requirements or characteristics desired.

A preferred comonomeric unit that can be included in a polymer of the present invention is the methacrylate unit obtained from the polymerizable methacrylate monomer of the formula (XXV)

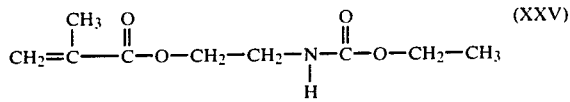

(XXV)

This monomer is readily polymerizable with the polymerizable pyridinium ylides hereof. A preferred copolymer is a copolymer of this monomer and the preferred pyridinium aminimide monomer corresponding to the repeating unit of formula (XIII). Good results are provided upon irradiation of this preferred copolymer. Other ethylenically unsaturated comonomers can, however, be used and examples of such include acrylic acid; methacrylic acid; 2-acrylamido-2-methylpropane sulfonic acid; N-methyl acrylamide; methacrylamide; ethyl acrylate; butyl acrylate; methyl methacrylate; N-methyl methacrylamide; N-ethyl acrylamide; N-methylolacrylamide; N,N-dimethyl acrylamide; N,N-dimethyl methacrylamide; N-(n-propyl) acrylamide; N-isopropyl acrylamide; N-($\beta$-hydroxy ethyl) acrylamide, N-($\beta$-dimethylamino) acrylamide; N-(t-butyl) acrylamide; N-[$\beta$-(dimethylamino)ethyl] methacrylamide; 2-[2'-(acrylamido)ethoxy]ethanol; N-(3'methoxy propyl)acrylamide; 2-acrylamido-3-methyl butyramide; acrylamido acetamide; methacrylamido acetamide; 2-[2'-methacrylamido-3'-methyl butyramido]acetamide; and diacetone acrylamide.

Polymers hereof containing the repeating units of formulas (I) or (II) pendant from the backbone thereof can be readily prepared by polymerization in known manner of the corresponding polymerizable monomeric compound of the formulas (XXVI) or (XXVII) as follows

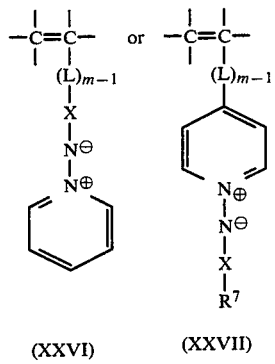

(XXVI)    (XXVII)

wherein X, m, L and $R^7$ have the meanings hereinbefore described. Various preparative routes to the polymerizable monomers can be used depending upon the nature of the L and X moieties desired in the polymer; and suitable synthetic methods will be known to those skilled in the art. For example, preferred polymerizable monomers useful in the practice of the present invention have the formula

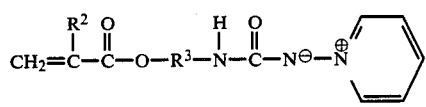

wherein $R^2$ and $R^3$ are as previously defined. These compounds can be prepared by the reaction of an isocyanato ester of acrylic, methacrylic or 2-chloroacrylic acid having the formula

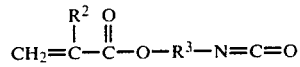

(wherein $R^2$ and $R^3$ are as previously defined) with a 1-amino-pyridinium salt of the formula

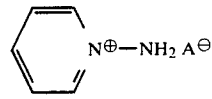

wherein $A^\ominus$ represents a halide counteranion such as chloride, bromide or iodide. The isocyanatoalkyl ester starting materials are known compounds and their method of preparation is described, for example, in U.S. Pat. No. 2,718,516 (issued Sept. 20, 1955 to N. M. Bortnick). Similarly, the 1-amino-pyridinium salts and their preparation are described in Organic Syntheses, Collective Vol. 5, pp. 43-45. The reaction is illustrated by reference to the following reaction scheme which shows the reaction of the prepared 2-cyanatoethyl methacrylate and 1-amino-pyridinium chloride in the presence of potassium carbonate:

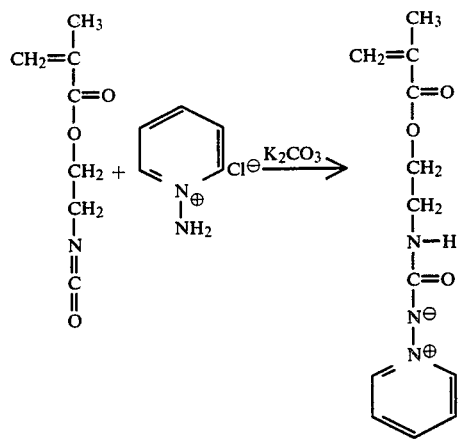

The ethylenically unsaturated polymerizable monomers can be polymerized using known polymerization techniques such as solution polymerization using free radical or redox initiation. Suitable initiators include azobisisobutyronitrile and azo-bis-4-cyano-pentanoic acid, although other catalysts can be employed.

Condensation-type polymers in which the pyridinium ylide moiety is a part of a polymeric backbone can be prepared by resort to known polymerization methods used in the preparation of condensation polymers. Solution polymerization or interfacial polymerization techniques can be used depending upon the nature of the particular monomers used in the polymerization.

The polymeric pyridinium ylides can be converted to their corresponding N-acyl-diazepines using a source of actinic irradiation of sufficient intensity. In general, ultraviolet radiation provides good results; other sources of actinic irradiation can, however, be employed. It will be appreciated that the amount of irradiation required to effect the desired conversion will vary with the wavelength and the intensity of the radiation source and will vary with the absorption properties of the pyridinium ylide moiety of the polymer employed. The absorption properties, can vary with the presence or absence of substituent groups on the pyridinium nucleus. Appropriate exposure times and conditions can be employed depending upon these considerations. In general, a source of ultraviolet irradiation can be used in conjunction with exposure times in the range from less than one to about 30 minutes or more.

The novel polymers produced from the photosensitive ylide polymers by photolytic reaction contain N-acyl-diazepine moieties of the formulas (XXVIII) and (XXIX)

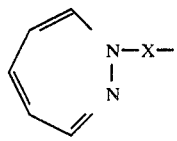
(XVIII)

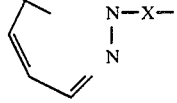
(XXIX)

The polymers containing these moieties are referred to herein for convenience as N-acyl-diazepine polymers. These polymers have the structure of the corresponding pyridinium ylide polymers described herein, except for the presence of N-acyl-diazepine moieties of formulas (XXVIII) and (XXVIX) in place of the corresponding pyridinium ylide moieties (I) and (II) of the precursor polymers. Examples of repeating units of polymeric N-acyl-diazepines of the invention include the following, formulas (XXX) to (XXXIV):

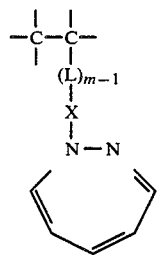
(XXX)

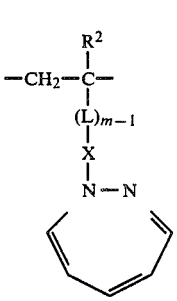
(XXXI)

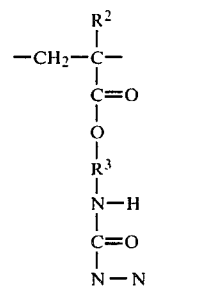
(XXXII)

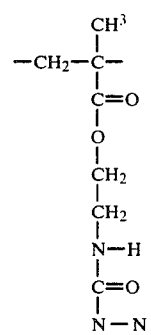
(XXXIII)

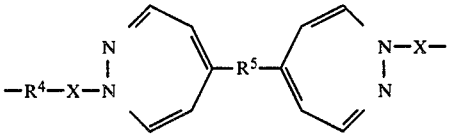
(XXXIV)

It will be noted that the photolysis of aminimides derived from pyridines, and the production of diazepines therefrom, are described by W. J. McKillip et al., in Chemical Reviews, Vol. 73, No. 3, pp. 272–273 (1973). The formation of pyridine and nitrene side-reaction products (and the effects of triplet photosensitizers such as eosine or 3,4-benzopyrene on such formation) are also described therein. It will be appreciated that nitrene and pyridine side-reaction products may also be formed in connection with the photolytic reaction employed in the practice of the present invention. If desired, a triplet sensitizer can be employed in combination with the polymeric pyridinium ylides of the present invention so as to promote nitrene or isocyanate formation and the production therefrom of cross-linking reactions (by reaction of nitrene or isocyanate moieties with compounds having an active hydrogen atom). Accordingly, triplet sensitization can be employed, if desired, to modify the physical properties of the polymeric N-acyl-diazepine produced by the practice of the present invention.

The polymeric pyridinium ylides can be used for a variety of purposes, including treatment and hydrophobization of surfaces. Thus, a layer of the polymer can be applied from solution to a suitable substrate which is then subjected to exposure to a source of irradiation sufficient to effect the desired conversion of the ylide to the corresponding N-acyl diazepine. Water can be employed and will be a preferred solvent material for the preparation of a coating composition which can be conveniently applied to the substrate by spraying, dipping, roll coating or the like. Other solvents can, however, be used and examples of such solvents are methanol, ethanol and trichloromethane. A coating composition suited to application to various substrate materials will typically contain the desired pyridinium ylide polymer in a concentration of about 3 to 4% by weight, although other concentrations can be used depending upon the particular polymer employed, the nature of the solvent utilized, the method of application and the nature of the particular substrate. Various additives such as surfactants, coating aids, viscosity-controlling agents, UV stabilizers, photoinitiators, triplet sensitizers or the like can be included, provided that such agents do not interfere with the desired conversion of the pyridinium ylide compound to the corresponding N-acyl-diazepine.

The polymers can be used for the treatment of substrates such as glass, metal, plastic, such as polyethylene terephthalate or cellulose acetate, or fabrics. Sheets, swatches, scrims, ropes or other fibers can be sprayed, dipped or otherwise coated with the polymeric ylide compound and can be, then, subjected to actinic irradiation to provide a polymeric (N-acyl-diezepine) surface exhibiting insolubility, hydrophobicity or water repellency.

The resistance of the irradiated polymeric materials to water and other solvent materials, including solvent etching materials, allows for the use of the pyridinium ylide polymers hereof in the production of articles wherein the irradiated polymer comprises an image pattern. Thus, a layer of pyridinium ylide polymer on a suitable substrate material can be exposed to actinic irradiation in an imagewise manner to provide a recordation or image of the subject in polymeric N-acyl-diazepine. Exposure of the layer of pyridinium ylide polymer can be accomplished through a negative, a photomask or the like. Unexposed areas can be removed by dissolution in water to provide the desired image in polymeric N-acyl-diazepine.

In FIG. 1 is shown in cross-section an edge view of an article 10 of the invention including a suitable support material 12 carrying a photosensitive layer 14 of a polymeric pyridinium ylide. Support material 12 can be glass, metal, plastic, cloth or any like substrate material to which the polymeric pyridinium ylide can be suitably applied, as by coating, dipping or the like, and which can be subjected to irradiation for conversion of the pyridinium ylide polymer to the corresponding N-acyl-diazepine. The nature of the support will normally be determined by the particular application for the product. Thus, a metallic support material may be preferred for the production of lithographic or like printing plates while glass or plastic support materials such as polyethylene terephthalate may be preferred for the production of electro-optic display or like articles. The polymeric pyridinium ylide layer 14 can comprise any of the photosensitive polymers as described herein.

Article 10 carrying photosensitive polymer layer 14 can be subjected to any source of radiation sufficient to convert the ylide polymer to an N-acyl-diazepine as described hereinbefore, to provide any of a variety of products. If desired, the irradiation can be applied to the surface of photosensitive polymeric layer 14 in a non-selective manner so as to provide article 10 with a hydrophobic or waterproof layer 14. This will be appropriate where, for example, a garment or other protective fabric material 12 is desirably rendered hydrophobic or waterproof.

Figure 5:
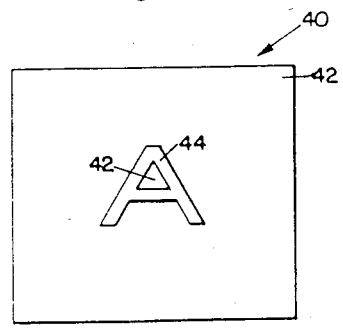
FIG. 5 is a plan view of an image in hydrophobic polymer material formed on a substrate material by the method of the present invention.

According to certain preferred applications for the pyridinium ylide polymers hereof, the polymer will be irradiated selectively so as to provide a pattern or image in polymeric N-acyl-diazepine. In FIG. 5 is shown a plan view of an article 40 comprising a support material 42 carrying an image 44 in polymeric N-acyl-diazepine. Such an article can be conveniently provided, for example, by coating a substrate or support material 42 with a layer of polymeric pyridinium ylide. A stencil or mask corresponding to image 44 can be superposed upon the polymeric pyridinium ylide layer. Exposure of the polymer layer, through the stencil or mask, effects the desired N-acyl-diazepine conversion and, provides a water-insoluble or hydrophobic area 44. Rinsing or washing of the article in water or other solvent results in removal of the water-soluble pyridinium ylide polymer from unexposed (shielded) areas 42 so as to define the desired image.

If desired, hydrophobic image material 44 can be dyed or otherwise colored with material having an affinity for hydrophobic materials. In this case, support material can be composed of hydrophilic material so as to permit selective dyeing of image area 44 to the exclusion of the dyeing of support material 42. The resulting article can be used as a plate in duplication or like printing methods.

Figure 2:
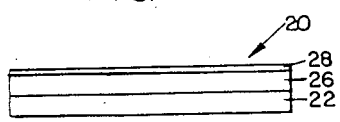
FIG. 2 is a cross-sectional edge view of a photosensitive article of the invention carrying an optional metallic layer.

In FIG. 2 is shown a preferred article 20 suited to application in the production of a photoresist, electrode pattern or printed circuit. Shown on support 22 (comprised of glass, insulator board or the like) is a layer 26 of metal or other material that can be suitably etched by physical or chemical means. Examples of such materials include copper, silver, indium tin oxide and iron/nickel alloy. The thickness of metal layer 24 can vary with the nature of the metal and the intended application. On metallic layer 26 is a layer 28 of photosensitive polymeric pyridinium ylide.

Figure 3:
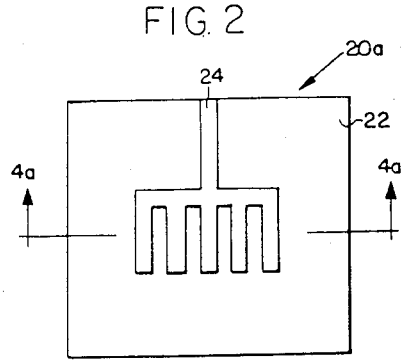
FIG. 3 is a plan view on an enlarged scale of a metallic electrode pattern formed on a substrate material.

In FIG. 3 is shown an article 20A having a metallic electrode pattern 24 formed on a support material 22. The pattern, comprised of metal and a protective overlayer of polymeric N-acyl-diazepine, is formed by the method of the present invention from article 20 shown in FIG. 2. Article 20 is selectively irradiated through a stencil or photomask according to the pattern defined by area 24 in FIG. 3. Radiation sufficient to convert the polymeric pyridinium ylide to the corresponding N-acyl-diazepine polymer is employed. Removal of the mask and immersion of the photo-exposed article into a metal etching bath effects removal (in unexposed areas) of water-soluble pyridinium ylide polymer 28 and underlying metal 26, leaving on support 22, the desired electrode pattern 24.

Figure 4A:
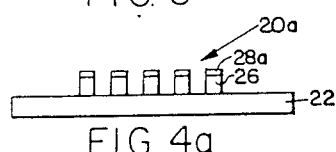
FIG. 4a is a cross-sectional view of an electrode pattern taken along the lines 4a—4a of FIG. 3 and showing a support carrying electrodes having a protective polymeric layer thereon.
Figure 4B:
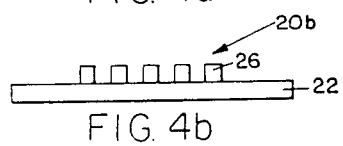
FIG. 4b is a cross-sectional view of the electrodes of FIG. 4a with the protective polymer removed therefrom.

In FIG. 4a, there is shown in cross-section, along the lines 4a—4a of FIG. 3, the article 20a. Metallic electrode material 26 is protected by hydrophobic N-acyl-diazepine polymer material 28a. If desired, polymeric material 28a can be removed from the metallic electrode material 26 by dissolving the polymer in an organic solvent such as dimethylformamide. The resulting article 20b is shown in FIG. 4b.

EXAMPLE 1

To a mixture of three grams of 1-amino-pyridinium chloride in 45 mls. of ethanol and seven grams of powdered anhydrous potassium carbonate, was added (with stirring and over a period of one-half hour) a solution of 3.6 grams of 2-isocyanato-ethyl methacrylate in ten mls. of tetrahydrofuran, absolute. The resulting solution was filtered and evaporated to dryness. The residue was dissolved in a 100/15 mixture (by volume) of trichloromethane and methanol and the resulting solution was filtered through a short column containing 15 grams of silica gel. The production fractions were collected, evaporated to dryness and recrystallized from methyl acetate. The product, a white crystalline solid, was a monomer having the formula

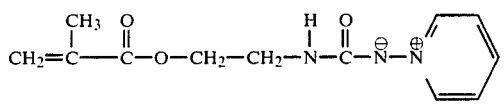

Molecular structure was confirmed by thin layer chromatographic and nuclear magnetic resonance technques.

EXAMPLE 2

To a solution of 2.06 grams of 1-amino-pyridinium chloride in 35 mls. of ethanol, were added seven grams of powdered anhydrous potassium carbonate. To the resulting mixture, was added a solution of 1.8 grams of methacryloyl chloride in five mls. of tetrahydrofuran, absolute. The addition was accomplished with vigorous stirring, and in a manner to maintain the observed purple coloration. Upon completion of the addition, the resulting solution was filtered and evaporated. The resulting solid product was recrystallized twice, using acetone, to yield 1.75 grams of white needle-like crystals (70%). The product was a monomer having the formula

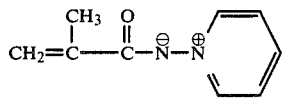

The monomer showed good solubility in water, methanol, trichloromethane; slight solubility in acetone and tetrahydrofuran; and insolubility in hydrocarbons. Molecular structure was confirmed using thin layer chromatograhic and nuclear magnetic resonance techniques.

EXAMPLE 3

A homopolymer of the monomer of Example 1 was prepared in the following manner. The monomer (0.7 gram) was dissolved in 8 to 10 mls. of distilled water in a polymerization tube and 30 mgs. of azo-bis-4-cyano-pentanoic acid were added. Oxygen was removed in conventional manner by a repeated sequence of freezing and vacuum steps. The tube was sealed under vacuum and polymerization was effectd by heating the tube to a temperature of from 64° to 70° C. overnight in a bath. The resulting polymer was precipitated by introducing the product into a 20- to 50-fold (vol./vol.) volume of acetone and the polymer was recovered.

The polymer was also prepared in a polymerization tube in the same manner, except that, the polymer was precipitated into tetrahydrofuran and recovered. In each case, the resulting polymer showed solubility in water, methanol, ethanol and trichloromethane.

EXAMPLE 4

A homopolymer containing repeating units of formula (XI) was prepared using the procedure as set forth in Example 3. The monomer used for the polymerization was prepared by the reaction of N-(2-hydroxypropyl)-methacrylamide and N,N'-carbonyldiimidazole; and the reaction of the resulting amido with 1-amino-pyridinium chloride in the presence of potassium carbonate, to convert the amido to the pyridinium aminimide monomer. The homopolymer prepared by polymerization of the monomer showed solubility in water, methanol, ethanol and trichloromethane.

EXAMPLE 5

In a polymerization tube, 336 mgs. of the monomer of Example 1, 267 mgs. of the monomer of formula (XXV), and 9.3 mgs. of azo-bis-4-cyano-pentanoic acid were dissolved in seven mls. of a 1:1 (by vol.) mixture of water and methanol. Oxygen was removed using a repeated sequence of freezing and vacuum steps, and the reaction tube was sealed under vacuum. The tube was heated to 64° C. in a water bath overnight. The solvent was removed from the resulting polymerization product by evaporation and the residue was taken up into ten mls. of trichloromethane. The copolymer was precipitated into about 400 mls. of tetrahydrofuran. The slightly yellow polymer was collected and dried in a vacuum oven at 45° C. for three hours. The product (450 mgs.; 75% yield) was a copolymer having the formula:

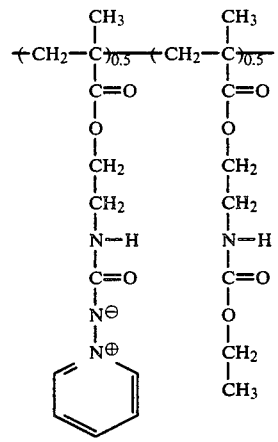

The copolymer showed solubility in water, methanol, ethanol, and trichloromethane; and insolubility in acetone, tetrahydrofuran, ether and ethyl acetate.

EXAMPLE 6

This Example illustrates the production of a pattern of iron-and-nickel alloy on a glass substrate.

Samples of glass plate material (2.54×2.54 cm.) having, on each, a layer of sputtered iron-and-nickel magnetic alloy (thickness about one micron) were cleaned with methanol. A four-percent (by weight) solution of the copolymer of Example 5 was used to spin coat a layer of polymer onto the metal surface of each of the glass plate samples. Samples were coated using water as the solvent. Other samples were coated using trichloromethane or methanol. Spin coating was performed at about 2000 rpm for two minutes.

Each sample was then selectively exposed and processed in the following manner. A resolution target (a photomask) was positioned over the polymer-coated sample so as to permit exposure of areas not covered, and to prevent exposure of masked areas, according to the pattern of the mask. The masked sample was then exposed for 20 minutes to the irradiation of a 12-watt long-wave (366 nm.) ultraviolet lamp. The mask was removed and the sample was placed into an etching bath of commercially available etchant (Nickel Etchant, Type I, Transene Company, Inc. Rowley, Mass.) diluted 1:3 with water. Polymer (pyridinium aminimide) and underlying metal, in the unexposed areas of the sample, were removed from the sample by the action of the etching composition. Conversion of polymeric pyridinium aminimide to the corresponding N-acyl-diazepine, in areas of exposure, provided protection of the underlying metal against removal by the etching bath. The result was a product having, in exposed areas, a metallic pattern corresponding to the pattern of the mask.

EXAMPLE 7

This Example illustrates the production of a copper pattern on printed circuit board material.

An insulator board material having a layer of copper thereon (a commercially available material used for the production of printed circuit boards) was treated in the following manner. Samples of the board material (2.54×2.54 cm.) were spin coated (over the copper-clad surface of the board) with a solution of the copolymer of Example 5, using the procedure described in Example 6. The samples were then masked and photoexposed as described therein. Upon removal of the mask, the samples were placed into a bath of aqueous ferric chloride etching material. Areas of polymeric pyridinium aminimide and underlying copper were removed (in unexposed areas) by the effect of the ferric chloride etching bath. Conversion of the polymeric pyridinium aminimide to the corresponding N-acyl-diazepine (in exposed areas) provided protection for the underlying copper against removal by the etching bath. The result was a printed circuit board having a copper pattern thereon corresponding to the pattern of the mask.

EXAMPLE 8

This Example illustrates the production of an image in N-acyl-diazepine polymer on a silicon wafer material.

Samples of commercially available silicon wafers were spin coated with a 3% solution of the copolymer of Example 5. Samples were coated using water as the solvent; other samples were coated using trichloromethane. Spin coating was performed at 2000 rpm for two minutes. The coated silicon wafers were exposed through a resolution target, using a 12-watt ultraviolet (366 nm.) lamp. Exposure times ranged from 21 to 25 minutes depending upon intensity. The photoexposed wafers were immersed into a water bath for about five to ten seconds to remove pyridinium aminimide polymer in unexposed regions. The result was an image in N-acyl-diazepine polymer of about 0.05 micron thickness corresponding to the pattern of the resolution target. The image showed good resolution of lines of 2.5 micron spacing.

Adhesion of the polymeric image to the wafers was evaluated by sticking a strip of cellophane tape onto the polymer image; removing the tape therefrom; and inspecting for evidence of removal of polymer image. Inspection showed no evidence of such removal.

EXAMPLE 9

Using the method described in Example 8, images were prepared on quartz and cellophane substrate materials from the polymers of Examples 3, 4 and 5. Similar results were obtained in each case in that images of the resolution target in N-acyl-diazepine polymer were recorded on the substrate maerials. Each of the samples, using the adhesion test described in Example 8, showed no evidence of removal of image upon removal of the cellophane tape.

EXAMPLE 10

This Example illustrates the use of a pyridinium aminimide polymer for the hydrophobization of a substrate surface.

Samples of quartz and cellophane sheet material were coated with polymers of Examples 3, 4 and 5, using the method described in Example 8. The samples were irradiated non-selectively, i.e., without a resolution target or mask. The polymeric pyridinium aminimide coating was in each case converted by the photoexposure to a corresponding N-acyl-diazepine polymer exhibiting hydrophobicity and water repellency. Application of water to the exposed polymer surface and tilting thereof, showed the beading and roll-off without a remaining trace of the applied water. In contrast, similarly coated samples which were not photoexposed, showed spreading (wetting) of added water and evidence of dissolution of the pyridinium aminimide polymer.

What is claimed is:

1. A polymeric pyridinium ylide adapted upon exposure to actinic radiation to formation of a polymeric N-acyl-diazepine, said polymeric pyridinium ylide comprising a plurality of repeating units having the formula

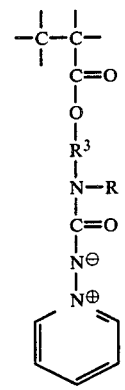

wherein R is hydrogen, alkyl, aryl, alkaryl or aralkyl and $R^3$ is a divalent alkylene radical.

2. The polymeric pyridinium ylide of claim 1 wherein R is hydrogen.

3. The polymeric pyridinium ylide of claim 2 wherein $R^3$ is 1,2-ethylene.

4. The polymeric pyridinium ylide of claim 1 wherein said repeating units have the formula

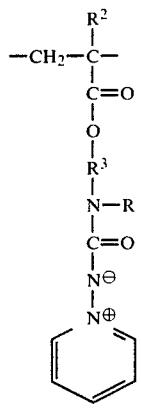

wherein R is hydrogen, alkyl, aryl, alkaryl or aralkyl, $R^2$ is hydrogen, halo or lower alkyl and $R^3$ is a divalent alkylene radical.

5. The polymeric pyridinium ylide of claim 4 wherein R is hydrogen.

6. The polymeric pyridinium ylide of claim 5 wherein $R^3$ is 1,2-ethylene.

7. The polymeric pyridinium ylide of claim 6 wherein $R^2$ is methyl.

8. The polymeric pyridinium ylide of claim 4 having repeating units from an ethylenically unsaturated copolymerizable monomer.

9. The polymeric pyridinium ylide of claim 8 wherein said repeating units from said ethylenically unsaturated copolymerizable monomer have the formula

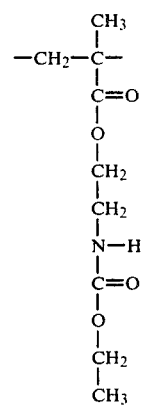

* * * * *